(12) United States Patent
Yang

(10) Patent No.: US 7,528,495 B2
(45) Date of Patent: May 5, 2009

(54) CHIP STRUCTURE

(75) Inventor: Yu-Lin Yang, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 11/550,304

(22) Filed: Oct. 17, 2006

(65) Prior Publication Data

US 2008/0012150 A1    Jan. 17, 2008

(30) Foreign Application Priority Data

Jul. 17, 2006    (TW) .............................. 95126002 A

(51) Int. Cl.
   *H01L 23/522*    (2006.01)
   *H01L 23/528*    (2006.01)
(52) U.S. Cl. .................. 257/786; 257/690; 257/737; 257/758; 257/E23.02; 257/E23.142; 257/E23.152
(58) Field of Classification Search ................. 257/690, 257/737, 786, 758, E23.02, E23.142, E23.152
   See application file for complete search history.

(56) References Cited

U.S. PATENT DOCUMENTS 4,740,700 A * 4/1988 Shaham et al. .............. 250/332
4,980,555 A   12/1990 Hartley et al. ............. 250/338.3
6,028,365 A * 2/2000 Akram et al. ................ 257/778
6,097,091 A * 8/2000 Ohsumi ...................... 257/758
6,157,079 A * 12/2000 Taguchi ...................... 257/737
6,433,427 B1 * 8/2002 Wu et al. ..................... 257/737
6,472,763 B2 * 10/2002 Fukuda et al. .............. 257/780
6,806,570 B1 * 10/2004 Lee et al. .................... 257/737
6,969,908 B2 * 11/2005 Yamaguchi ................. 257/734
6,982,565 B2 *  1/2006 Kirby ......................... 324/755
7,023,088 B2 *  4/2006 Suzuki et al. ............... 257/734
7,129,579 B2 * 10/2006 Ohsumi ...................... 257/737

* cited by examiner

*Primary Examiner*—Victor A Mandala
(74) *Attorney, Agent, or Firm*—J.C. Patents

(57) ABSTRACT

A chip structure including a substrate, at least one chip bonding pad, a passivation layer, at least one compliant bump, and at least one redistribution conductive trace is provided. The substrate has an active surface whereon the chip bonding pad is disposed. The passivation layer is disposed on the active surface and exposes the chip bonding pad. The compliant bump has a top surface and a side surface. At least part of the compliant bump is disposed on the passivation layer. One end of the redistribution conductive trace is electrically connected to the chip bonding pad and the other end thereof covers part of the side surface and at least part of the top surface of the compliant bump. Therefore, the chip bonding pad of the chip structure can be electrically connected to the corresponding electrical contact of the carrier through the compliant bump and the redistribution conductive trace.

27 Claims, 2 Drawing Sheets

CHIP STRUCTURE

CROSS-REFERENCE TO RELATED APPLICATION

This application claims the priority benefit of Taiwan application serial no. 95126002, filed on Jul. 17, 2006. All disclosure of the Taiwan application is incorporated herein by reference.

BACKGROUND OF THE INVENTION

1. Field of the Invention

The present invention relates to a chip structure. More particularly, the present invention relates to a chip structure having compliant bumps.

2. Description of Related Art

In semiconductor industry, the production of integrated circuits (IC) is mainly divided into three stages: IC design, IC process, and IC package.

In IC process, a chip is completed through wafer process, formation of IC, electrical testing, and wafer sawing, etc. A wafer has an active surface, which generally refers to the surface of the wafer having an active device thereon. When the IC inside the wafer has been completed, a plurality of bonding pads is disposed on the active surface of the wafer so that the chip formed eventually through wafer sawing can be electrically connected to a carrier through the bonding pads.

FIG. 1 is a side view of a conventional chip structure. Referring to FIG. 1, the conventional chip structure 100 includes a substrate 110, a plurality of chip bonding pads 120, a passivation layer 130, and a plurality of conductive bumps 140. The substrate 110 has an active surface 112 whereon the chip bonding pads 120 are disposed. The passivation layer 130 covers the active surface 112 and exposes the chip bonding pads 120. Besides, the conductive bumps 140 are respectively disposed on the chip bonding pads 120 as the media of electrically connecting to a glass substrate (not shown).

However, on the glass substrate, sometimes the electrical contacts (not shown) designed to be electrically connected to the corresponding conductive bumps 140 cannot be completely aligned with the corresponding conductive bumps 140 due to the wiring design or other factors, so that the chip bonding pads 120 cannot be electrically connected to the electrical contacts correspondingly. Thus, further redistribution of the chip bonding pads 120 is necessary.

SUMMARY OF THE INVENTION

Accordingly, the present invention is directed to provide a chip structure having its chip bonding pads suitable for being respectively connected to the electrical contacts of a carrier through compliant bumps and redistribution conductive traces.

To achieve the aforementioned and other objectives, the present invention provides a chip structure including a substrate, at least one chip bonding pad, a passivation layer, at least one compliant bump, and at least one redistribution conductive trace. The substrate has an active surface whereon the chip bonding pad is disposed. The passivation layer is disposed on the active surface and exposes the chip bonding pad. The compliant bump has a top surface and a side surface. At least part of the compliant bump is disposed on the passivation layer. One end of the redistribution conductive trace is electrically connected to the chip bonding pad, and the other end of the redistribution conductive trace covers part of the side surface and at least part of the top surface of the compliant bump.

As described above, when the chip structure is electrically connected to the electrical contacts on the carrier, the chip bonding pads can be electrically connected to the corresponding electrical contacts through the compliant bumps and the redistribution conductive traces by respectively connecting the compliant bumps to the electrical contacts. Besides, the material of the compliant bump is flexible, and part of the side surface of the compliant bump is disposed by the redistribution conductive trace, thus, when the chip structure and the carrier are pressed together, the compliant bump can be appropriately deformed so as to maintain a good electrical connection between the chip structure and the carrier. Moreover, since the chip bonding pads can be connected to a plurality of compliant bumps through the redistribution conductive traces, the contact area between the chip structure and the carrier can be increased and the bonding failure rate can be reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2A:
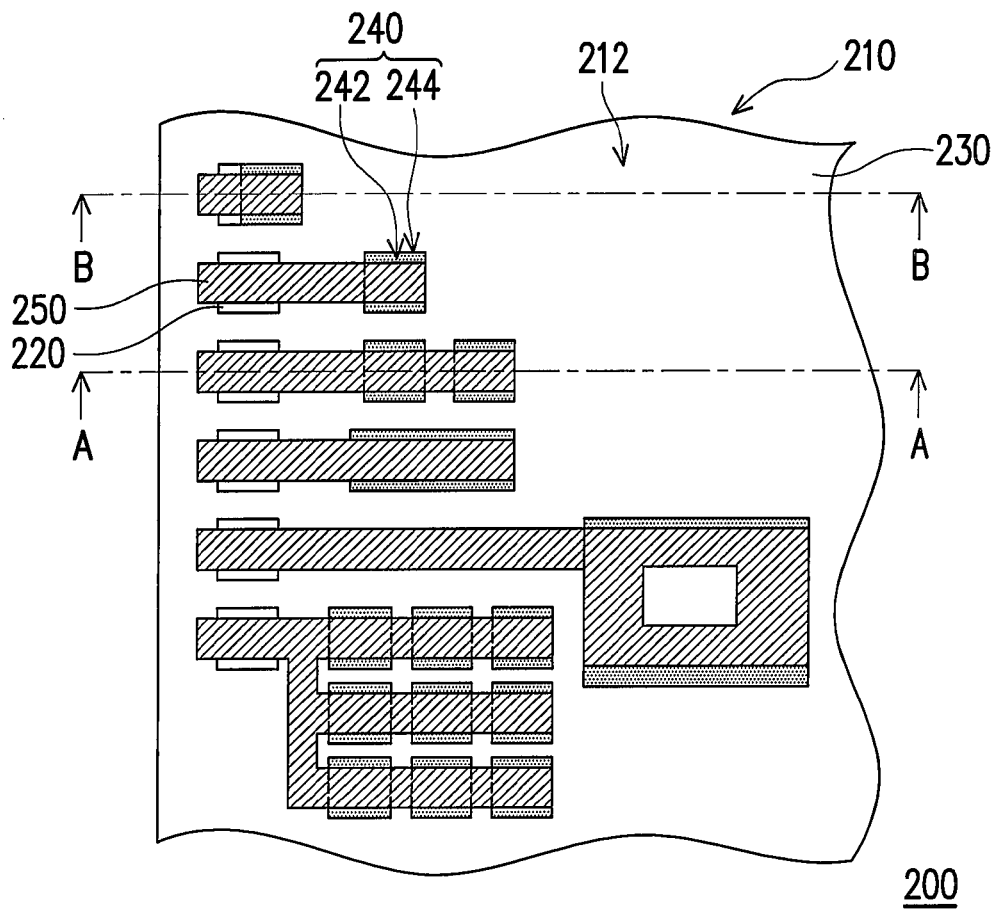
FIG. 2A is a vertical view of a chip structure according to an embodiment of the present invention.
Figure 2B:
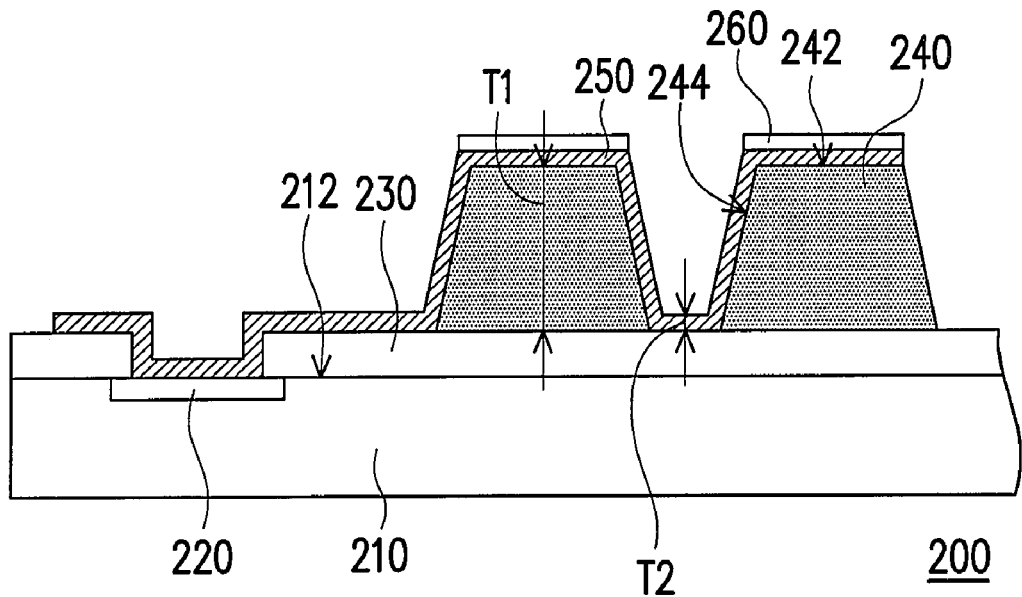
FIG. 2B is a cross-sectional view of the chip structure in FIG. 2A along line A-A.
Figure 2C:
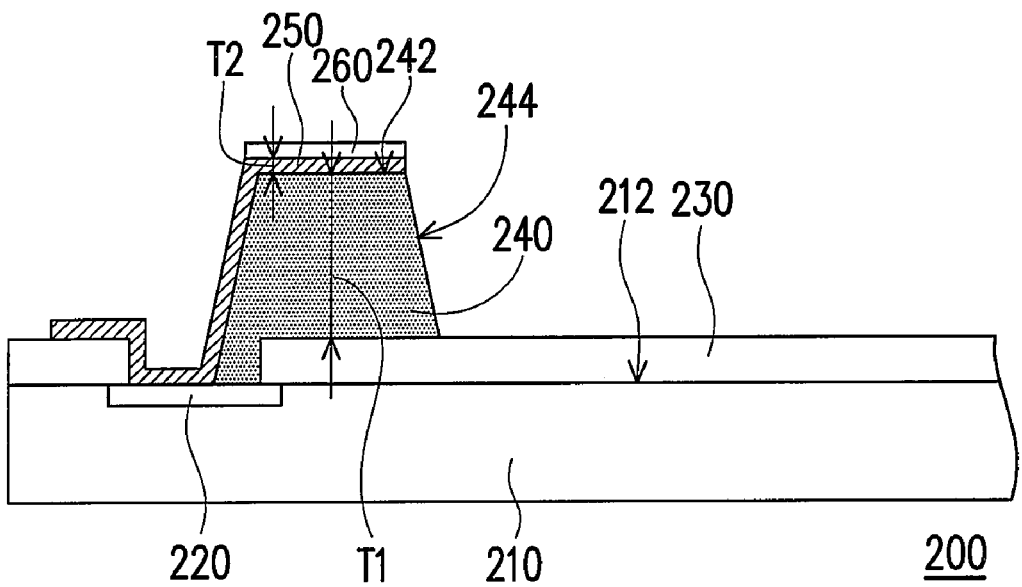
FIG. 2C is a cross-sectional view of the chip structure in FIG. 2A along line B-B.

FIG. 2A is a vertical view of a chip structure according to an embodiment of the present invention, FIG. 2B is a cross-sectional view of the chip structure in FIG. 2A along line A-A, and FIG. 2C is a cross-sectional view of the chip structure in FIG. 2A along line B-B. Referring to FIGS. 2A, 2B, and 2C, the chip structure 200 includes a substrate 210, at lest one chip bonding pad 220 (6 pieces shown in FIG. 2A demonstratively), a passivation layer 230, at least one compliant bump 240 (15 pieces shown in FIG. 2A demonstratively), and at least one redistribution conductive trace 250 (6 pieces shown in FIG. 2A demonstratively). The substrate 210 has an active surface 212 whereon the chip bonding pads 220 are disposed. The passivation layer 230 is disposed on the active surface 212 and exposes the chip bonding pads 220.

In addition, each compliant bump 240 has a top surface 242 and a side surface 244, wherein each compliant bump 240 is at least partially disposed on the passivation layer 230. Besides, one end of each redistribution conductive trace 250 is electrically connected to the corresponding chip bonding pad 220, and the other end of each redistribution conductive trace 250 correspondingly covers part of the side surface 244 and at least part of the top surface 242 of each compliant bump 240. Specifically, part of the side surface 244 of each compliant bump 240 is exposed by the redistribution conductive trace 250, and in the present embodiment, the redistribution conductive traces 250 may completely or partially cover the top surfaces 242 of the compliant bumps 240 respectively.

Figure 1:
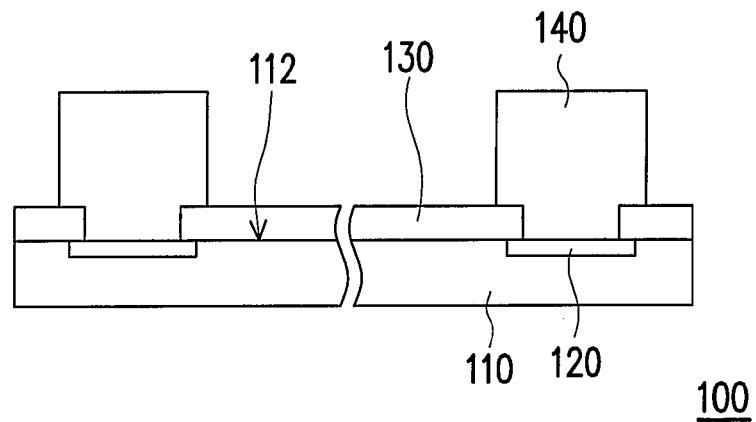
FIG. 1 is a side view of a conventional chip structure.

When the chip structure 200 is electrically connected to a plurality of electrical contacts (not shown) on a carrier (for example, a glass substrate, not shown), the chip bonding pads 220 can be electrically connected to the electrical contacts respectively through the compliant bumps 240 and the redistribution conductive traces 250 since the compliant bumps 240 and the electrical contacts are connected respectively. Thus, the problem that the chip bonding pads 120 and the electrical contacts of the carrier in the conventional chip structure 100 (as shown in FIG. 1) cannot be electrically connected completely can be resolved in the chip structure 200 of the present embodiment. Besides, since the material of the compliant bumps 240 is flexible and a part of the side surface 244 of each compliant bump 240 is disposed by the redistribution conductive trace 250, when the chip structure 200 and the carrier are pressed together, the compliant bumps 240 may be appropriately deformed so that an excellent electrical connection between the chip structure 200 and the carrier can be maintained.

Referring to FIG. 2A, in the present embodiment, the shape of the top surface 242 of each compliant bump 240 may be regular shape, such as rectangular or annular shape. However, the shape of the top surface 242 of each compliant bump 240 may also be circular shape, other regular shapes, or other irregular shapes. Besides, as to the relative positions in FIG. 2A, one end of the lowest redistribution conductive trace 250 may cover a plurality of compliant bumps 240, and the compliant bumps 240 may be arranged in an array. It should be specified here that the shapes of the top surfaces 242 of the compliant bumps 240 and the number and arrangement of the compliant bumps 240 can be changed according to the requirement of the designer, and the present embodiment is only used as an example but not for limiting the present invention.

Referring to FIG. 2B, in the present embodiment, some compliant bumps 240 may be disposed on the passivation layer 230 completely, and part of the redistribution conductive trace 250 in FIG. 2B may be disposed on the passivation layer 230, and the material of the passivation layer 230 includes polyimide or benzocyclobutene (BCB). However, referring to FIG. 2C, a compliant bump 240 may also be disposed on the chip bonding pad 220 and the passivation layer 230, and the compliant bump 240 may cover part of the chip bonding pad 220. Referring to FIGS. 2A, 2B, and 2C, the material of the compliant bumps 240 includes polyimide, and the thickness T1 of each compliant bump 240 (i.e. the distance between the top surface 242 of each compliant bump 240 and the passivation layer 230) may be greater than or equal, to 5 μm and may be smaller than or equal to 11 μm, which is, in mathematical expression, 5 μm<=T1<=11 μm. It should be specified here that actually the thickness T1 of each compliant bump 240 may be slightly different, that is, the compliant bumps 240 have different heights; however, the thickness T1 of each compliant bump 240 is still within the foregoing range.

Besides, referring to FIGS. 2B and 2C again, in the present embodiment, the surface roughness (i.e. the maximum roughness) of one ends of the redistribution conductive traces 250 located on the top surfaces 242 of the compliant bumps 240 may be greater than 0 μm and may be smaller than or equal to 1 μm. The thickness T2 of each redistribution conductive trace 250 may be greater than or equal to 2 μm and may be smaller than or equal to 6 μm. In addition, the chip structure 200 in the present embodiment further includes an anisotropic conductive film 260 (not shown in FIG. 2A) disposed on one ends of the redistribution conductive traces 250 located on the top surfaces 242 of the compliant bumps 240. The anisotropic conductive film 260 is used for adhering and electrically connecting one ends of the redistribution conductive traces 250 located on the top surfaces 242 of the compliant bumps 240 to the electrical contacts (not shown) of a carrier (not shown) respectively.

In overview, the chip structure in the present invention has at least following advantages:

1. When the chip structure is electrically connected to a plurality of electrical contacts (not shown) of a carrier, since the compliant bumps are respectively connected to the electrical contacts, the chip bonding pads can be electrically connected to the electrical contacts respectively through the compliant bumps and the redistribution conductive traces.

2. The material of the compliant bumps is flexible and part of the side surface of each compliant bump is not covered by the redistribution conductive trace, thus, when the chip structure and the carrier are pressed together, each of the compliant bumps can be appropriately deformed to maintain a good electrical connection between the chip structure and the carrier.

3. Since one of the chip bonding pads can be connected to a plurality of compliant bumps through one of the redistribution conductive traces, the contact area between the chip structure and the carrier can be increased and the bonding failure rate can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip structure, comprising:
    a substrate, having an active surface;
    at least one chip bonding pad, disposed on the active surface;
    a passivation layer, disposed on the active surface, exposing the chip bonding pad;
    a plurality of compliant bumps, each of the compliant bumps having a top surface and a side surface, wherein the compliant bumps are disposed on the passivation layer without being directly in contact with the chip bonding pad and arranged in a line; and
    at least one redistribution conductive trace, wherein each of the redistribution conductive trace connects one of the chip bonding pad and covers the compliant bumps corresponding to the connected chip bonding pad.

2. The chip structure as claimed in claim 1, wherein part of the redistribution conductive trace is disposed on the passivation layer.

3. The chip structure as claimed in claim 1, wherein the top surfaces of the compliant bumps are of regular shapes.

4. The chip structure as claimed in claim 3, wherein the top surfaces of the compliant bumps are rectangular.

5. The chip structure as claimed in claim 3, wherein the top surfaces of the compliant bumps are circular.

6. The chip structure as claimed in claim 3, wherein the top surfaces of the compliant bumps are annular.

7. The chip structure as claimed in claim 1, wherein the top surfaces of the compliant bumps are of irregular shapes.

8. The chip structure as claimed in claim 1, wherein the material of the compliant bumps comprises polyimide.

9. The chip structure as claimed in claim 1, wherein thickness of the compliant bumps is greater than or equal to 5 μm and smaller than or equal to 11 μm.

10. The chip structure as claimed in claim 1, wherein the surface roughness of one end of the redistribution conductive trace located on the top surface of one of the compliant bumps is greater than 0 μm and smaller than or equal to 1 μm.

11. The chip structure as claimed in claim 1, wherein the thickness of the redistribution conductive trace is greater than or equal to 2 μm and smaller than or equal to 6 μm.

12. The chip structure as claimed in claim 1, wherein the chip structure further comprises an anisotropic conductive film disposed on one end of the redistribution conductive trace located on the top surface of one of the compliant bumps.

13. The chip structure as claimed in claim 1, wherein the material of the passivation layer comprises polyimide or benzocyclobutene (BCB).

14. A chip structure, comprising:
   a substrate, having an active surface;
   at least one chip bonding pad, disposed on the active surface;
   a passivation layer, disposed on the active surface, exposing the chip bonding pad;
   a plurality of compliant bumps arranged in an array and disposed on the passivation layer, wherein each of the compliant bumps has a top surface and a side surface; and
   at least one redistribution conductive trace, wherein each of the redistribution conductive trace connects one of the chip bonding pad and covers the compliant bumps corresponding to the connected chip bonding pad.

15. The chip structure as claimed in claim 14, wherein the compliant bumps are disposed on the passivation layer without being directly in contact with the chip bonding pad.

16. The chip structure as claimed in claim 14, wherein part of the redistribution conductive trace is disposed on the passivation layer.

17. The chip structure as claimed in claim 14, wherein the top surfaces of the compliant bumps are of regular shapes.

18. The chip structure as claimed in claim 17, wherein the top surfaces of the compliant bumps are rectangular.

19. The chip structure as claimed in claim 17, wherein the top surfaces of the compliant bumps are circular.

20. The chip structure as claimed in claim 17, wherein the top surfaces of the compliant bumps are annular.

21. The chip structure as claimed in claim 14, wherein the top surfaces of the compliant bumps are of irregular shapes.

22. The chip structure as claimed in claim 14, wherein the material of the compliant bumps comprises polyimide.

23. The chip structure as claimed in claim 14, wherein thickness of the compliant bumps is greater than or equal to 5 μm and smaller than or equal to 11 μm.

24. The chip structure as claimed in claim 14, wherein the surface roughness of one end of the redistribution conductive trace located on the top surface of one of the compliant bumps is greater than 0 μm and smaller than or equal to 1 μm.

25. The chip structure as claimed in claim 14, wherein the thickness of the redistribution conductive trace is greater than or equal to 2 μm and smaller than or equal to 6 μm.

26. The chip structure as claimed in claim 14, wherein the chip structure further comprises an anisotropic conductive film disposed on one end of the redistribution conductive trace located on the top surface of one of the compliant bumps.

27. The chip structure as claimed in claim 14, wherein the material of the passivation layer comprises polyimide or benzocyclobutene (BCB).

\* \* \* \* \*